United States Patent
Holmes et al.

(10) Patent No.: US 6,441,464 B1
(45) Date of Patent: Aug. 27, 2002

(54) GATE OXIDE STABILIZATION BY MEANS OF GERMANIUM COMPONENTS IN GATE CONDUCTOR

(75) Inventors: Steven J. Holmes, Milton; Mark Charles Hakey, Fairfax; Toshiharu Furukawa; David Vaclav Horak, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/401,054

(22) Filed: Sep. 22, 1999

(51) Int. Cl.[7] .............................. H01L 31/117
(52) U.S. Cl. ...................... 257/616; 257/613
(58) Field of Search ................ 257/19, 22, 25, 257/52, 53, 55–57, 62, 63, 65, 66, 613–617, 407–412, 413

(56) References Cited

U.S. PATENT DOCUMENTS

| | | | |
|---|---|---|---|
| 5,019,882 A | | 5/1991 | Solomon et al. |
| 5,101,247 A | * | 3/1992 | Ozturk et al. |
| 5,121,174 A | * | 6/1992 | Forgerson, II et al. |
| 5,250,452 A | | 10/1993 | Ozturk et al. |
| 5,336,903 A | | 8/1994 | Ozturk et al. |
| 5,398,200 A | | 3/1995 | Mazuré et al. |
| 5,409,853 A | | 4/1995 | Yu |
| 5,536,667 A | | 7/1996 | Cho |
| 5,633,177 A | | 5/1997 | Anjum |
| 5,644,152 A | | 7/1997 | Rostoker et al. |
| 5,739,574 A | * | 4/1998 | Nakamura |
| 5,998,289 A | * | 12/1999 | Sagnes |

OTHER PUBLICATIONS

Alieu et al. ("Pure Ge mid–gap gate within an industrial high performance and low standby current 0.18 mm CMOS process," 1998 Symposium on VLSI Technology Digest of Technical Papers, Jun. 9–11, 1998, pp. 192–193.*
Wolf, "Silicon Processing for the VLSI Era, vol. 2—Process Integration," Lattice Press, vol. 2, pp. 84 and 111.*
Ben G. Streetman, "Solid State Electronic Devices," 1990, Prentice Hall, third edition, p. 356.*
Prabhakaran, K. et al., "Fabrication of Multiperiod $Si/SiO_2/Ge$ Layered Structure Through Chemical Bond Manipulation", *Appl. Phys. Lett.*, vol. 72, No. 24, Jun. 15, 1998.
Monget, C. et al., "Germanium Etching in High Density Plasmas for 0.18 $\mu m$ Complementary Metal–Oxide–Semiconductor Gate Patterning Applications", *J. Vac. Sci. Technol.*, B 16(4), Jul./Aug. 1998.

* cited by examiner

*Primary Examiner*—Nathan Flynn
*Assistant Examiner*—Kevin Quinto
(74) *Attorney, Agent, or Firm*—F. William McLaughlin; Eugene I. Shkurko; Mark F. Chadurjian

(57) ABSTRACT

A semi-conductor device includes a silicon substrate. A gate oxide dielectric layer is on the silicon substrate. A gate conductor includes a relatively thin layer of germanium on the dielectric layer. A relatively thick layer of gate conductor material is provided on the layer of germanium. Incorporating germanium at the gate conductor interface with the gate oxide stabilizes the gate oxide by providing a means of drawing charge trapping sites away from the oxide.

16 Claims, 2 Drawing Sheets

GATE OXIDE STABILIZATION BY MEANS OF GERMANIUM COMPONENTS IN GATE CONDUCTOR

FIELD OF THE INVENTION

The present invention relates to semi-conductor devices and, more particularly, to use of germanium in gate conductors.

BACKGROUND OF THE INVENTION

The fabrication of semi-conductor devices, such as field effect transistors, utilizes logic wafers containing isolation trench structures. A gate oxide dielectric layer is grown on the wafer. A film of gate conductor material is deposited over the dielectric layer. The gate conductor material might be, for example, silicon, tungsten, tungsten silicide, or another conductor. The gate conductor is patterned using standard photolithographic methods and then etched, stopping on the gate oxide layer.

Thin gate dielectrics are unstable and lead to reliability problems for logic and DRAM semi-conductor devices. The dielectric layer is destabilized by tunneling currents and the build-up of charge-trapping sites. The results of the destabilization are eventual degradation of the gate oxide material. This leads to direct shorts between the substrate and the gate conductor. The shorts cause device failure. It is desirable to devise a means for destabilizing the gate oxide dielectric layer such that device reliability can be improved for very thin gate oxide, for example, sub-30 nm gate oxides.

The present invention is directed to solving one or more of the problems discussed above in a novel and simple manner.

SUMMARY OF THE INVENTION

In accordance with the invention germanium is incorporated into a gate conductor material for a semi-conductor device.

In one aspect of the invention, a discrete film of germanium is utilized.

In another aspect of the invention, a composite film of germanium and conductor material is utilized.

Broadly, there is disclosed herein a semi-conductor device including a silicon substrate. A gate oxide dielectric layer is on the silicon substrate. A relatively thin layer of germanium is provided on the dielectric layer. A relatively thick layer of gate conductor material is provided on the layer of germanium.

It is a feature of the invention that the dielectric layer has a thickness susceptible to substantial tunneling degradation of the gate dielectric due to tunneling between the substrate and the gate conductor material.

It is another feature of the invention that the dielectric layer has a thickness less than about 60 angstroms.

It is a further feature of the invention that the germanium layer has a thickness in the range of about 5 to about 500 angstroms.

It is still another feature of the invention that the germanium layer has a thickness less than about 50 angstroms.

It is still a further feature of the invention that the dielectric layer comprises a layer of silicon dioxide.

It is yet another feature of the invention that the gate conductor material is selected from a group consisting of aluminum, silicon, tungsten, and tungsten silicide.

There is disclosed in accordance with another aspect of the invention a field effect transistor including a silicon substrate. A gate oxide dielectric layer is provided on the silicon substrate. A relatively thin layer of germanium silicide is provided on the dielectric layer. A relatively thick layer of gate conductor material is provided on the layer of germanium silicide.

It is a feature of the invention that the germanium silicide layer is in the range of about 50% to about 100% germanium.

It is still another feature of the invention that the germanium silicide is in the range of about 90% to about 100% germanium.

It is disclosed in accordance with yet another aspect of the invention the process of manufacturing a field effect transistor comprising the steps of providing a silicon substrate; forming a gate oxide dielectric layer on the silicon substrate; depositing a relatively thin layer of germanium or germanium silicide on the dielectric layer; and depositing a relatively thick layer of gate conductor material on the germanium or germanium silicide.

Further features and advantages of the invention will be readily apparent from the specification and from the drawing.

DETAILED DESCRIPTION OF THE INVENTION

In accordance with the invention, the problems discussed above are solved by incorporating germanium into a gate conductor material of a semi-conductor device. In order to stabilize the gate oxide, and to improve reliability, it is necessary to prevent the formation of charge trapping sites caused by the flow of current in and around the gate oxide. Incorporating germanium at the gate conductor interface with the gate oxide stabilizes the gate oxide by providing a means of drawing the charge trapping sites away from the oxide, as described, for example, in *J. Applied Physics*, vol. 81, p. 8079–8093, 1997, and *Jpn. J. of Applied Physics*, vol. 35, p. 992–5, 1996. The germanium also stabilizes the gate oxide by removing a means of gate oxide destruction—reduction of the gate oxide by adjacent atoms of silicon in the polysilicon gate conductor. It is well known that the silicon oxygen bond is 23 Kcal/mole more stable than the Ge-oxygen bond. Thus, placing germanium in direct contact with the gate oxide, rather than Si, serves as a means of stabilizing the gate oxide as current is passed through it into the gate conductor, either by tunneling or by channels created by charge trapping sites. Silicon provides a relatively unstable gate oxide-gate conductor interface, as do aluminum or tungsten gate conductors. Germanium is a useful material to stabilize the gate oxide because it has appropriate redox chemistry, and it is readily compatible with silicon devices, as it fails to migrate in or degrade the semiconductor properties of Si materials.

Other materials that might be useful in this type of application are Tellurium and Selenium. For these materials, the tendency to oxidize is also much less than silicon by about 35 kcal/mole for Te and 38 kcal/mole for Se. These other materials would probably not be used as pure materials, due to poorer conductivity characteristics, such as the Ge might be, but would more likely be used as components of a Ge film or Si/Ge film or Si film. The bonding of Te and Se to Ge and Si is also weak, indicating that these materials might also be good at drawing reactive sites away from the gate oxide. Other possible materials are GexTey, where x ranges from 0.6 to 1, preferably about 0.8, and y ranges from 0.4 to 0, preferably about 0.2. Composites such as SixGeyTez, or SizGeySez, or SixGeyTezSew etc. are also possible.

Figure 1:
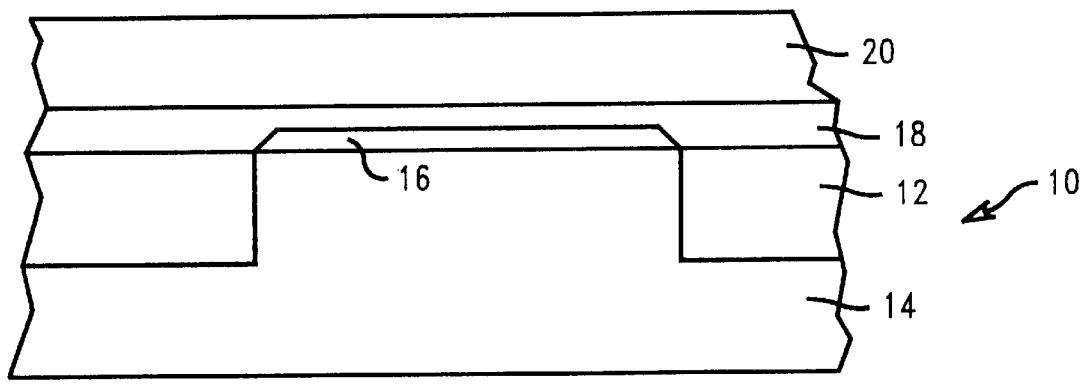
FIGS. 1–3 illustrate a process of forming a semi-conductor device in accordance with the invention.

Referring to FIG. 1, a standard logic wafer 10 includes isolation trenches 12 formed on a silicon substrate 14. The isolations 12 can be fabricated by conventional techniques. A gate dielectric or insulating layer 16 is formed on the surface of the substrate 14. The dielectric layer 16 has a thickness susceptible to substantial tunneling between the substrate and gate conductor material. The dielectric layer may have a thickness less than about 60 angstroms. The dielectric layer 16 may comprise, for example, a layer of silicon dioxide. Alternatively, the layer 16 may comprise silicon oxynitride, silicon nitride, titanium oxide, or tantalum oxide.

A thin film layer 18 of germanium or a composite film of germanium and a conductor material, such as germanium silicide, is deposited over the gate oxide layer 16.

The thickness of the layer 18 is in the range of about 5 angstroms to about 500 angstroms. Advantageously, the layer 18 has a thickness less than about 50 angstroms. Particularly, the thickness should be less than an amount that could be used to significantly alter the work function of the resulting gate. It needs to be at least thick enough to chemically isolate the gate oxide layer 18 from the reactive material in the gate conductor itself, which could be silicon, tungsten, tungsten silicide, aluminum, etc. The layer 18 can be deposited by plasma enhanced CVD using germanium alone or in combination with silane to make the germanium silicide, by thermal CVD for germanium silicide, or JET deposition for either germanium or germanium silicide. The range of composition of the film would be 100% germanium, preferably, but also compositions of germanium silicide in which the silicon content is substantially reduced relative to normal silicon gate structures. For example 90% to 100% germanium would be most preferable, with 50% to 90% germanium finding some benefit but being less preferable.

A layer 20 of gate conductor material is deposited over the layer 18 to produce a film stack. The layer 18 might be on the order of 1,000 to 2,000 angstroms of silicon, tungsten, or tungsten silicide, or the like, using standard CVD methods. The anneal of the film stack shown in FIG. 1 should be in the range 450–500 C. to avoid substantial intermixing of the germanium and silicon materials, however, higher temperatures are possible depending on the duration of the anneal.

Figure 2:
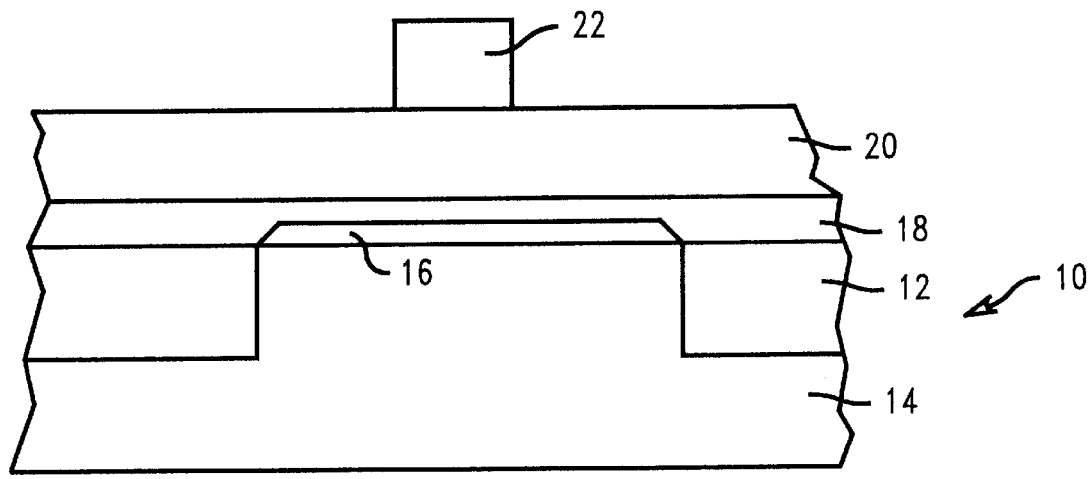
Figure 3:
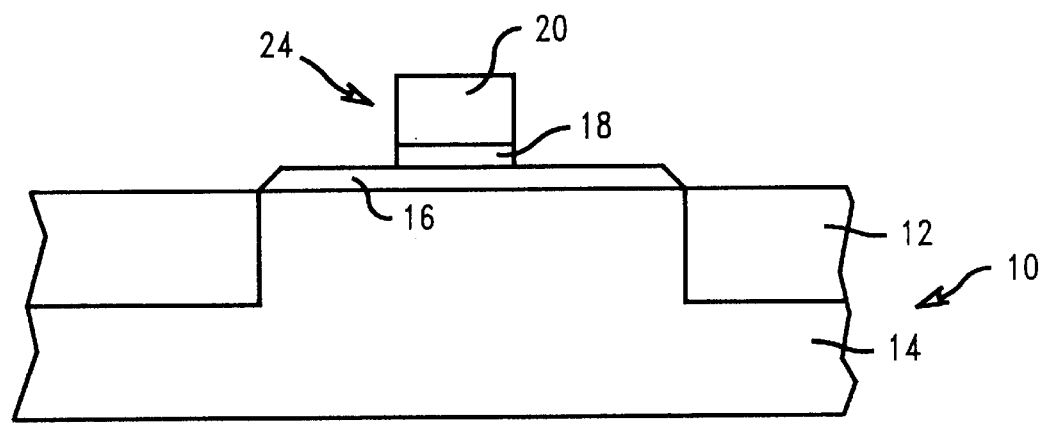

The gate conductor material is then patterned using standard photolithographic methods. Particularly, a layer of photo resist is applied over the layer 20. The photo resist is patterned to provide a patterned layer 22, see FIG. 2. The pattern is appropriate to form a gate conductor. Thereafter, the device is etched and the photo resist is stripped to produce the gate conductor 24 shown in FIG. 3. The etching includes the thin layer 18 of germanium or germanium silicide, in addition to the gate conductor material layer 20, stopping on the gate oxide layer 16. The germanium film 18 can be etched with standard etch gases and etch processes that apply to silicon.

Thereafter, standard processing is utilized to complete construction of the device 10.

Figure 4:
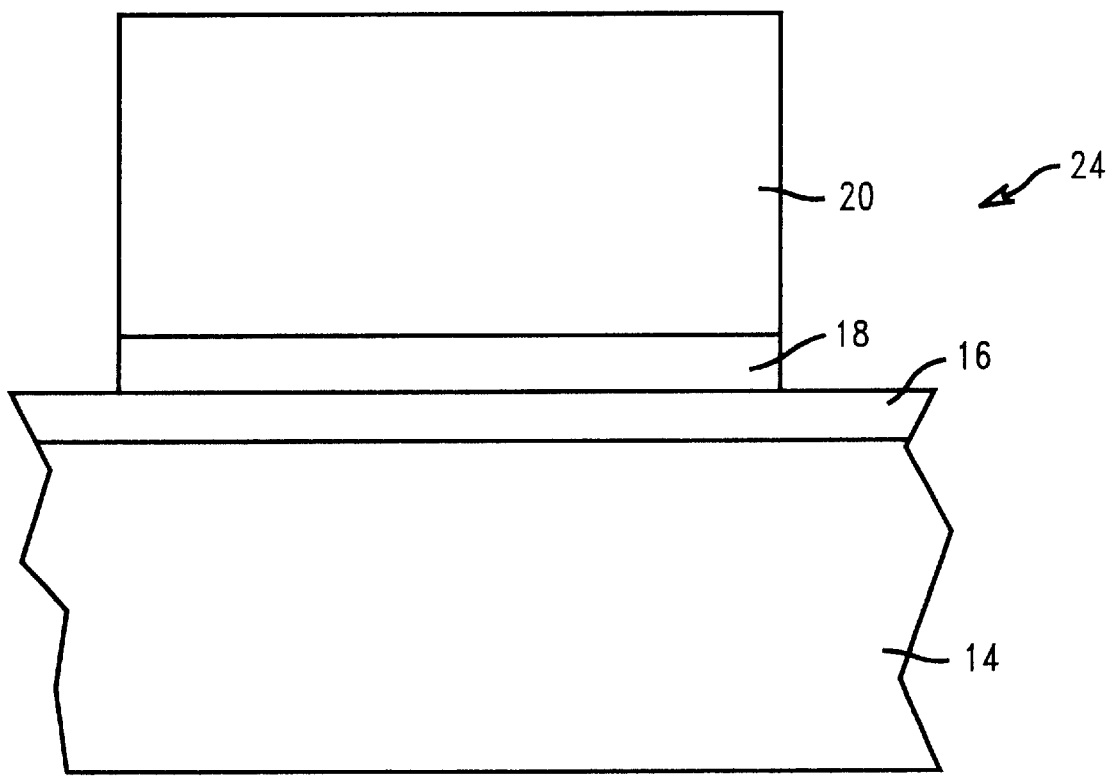
FIG. 4 is an enlarged view illustrating a gate conductor formed in accordance with the process of FIGS. 1–3.

In accordance with the invention, the germanium or germanium silicide layer 18 may reside directly on the gate oxide dielectric layer 16, as shown, or be separated by a thin film of silicon, such as 10–100 angstroms. The resulting structure is illustrated in greater detail in FIG. 4. The germanium or germanium silicide layer 18 serves two functions in the gate conductor 24. First, it serves as a means for removing trapping sites from the gate oxide layer 16, and thus prevents the degradation of the gate oxide. Secondly, it acts to prevent the reduction of the gate oxide by removing silicon atoms from direct proximity to the silicon oxide dielectric film. The oxidation of germanium by silicon oxide is energetically unfavorable by about 90 Kcal/mole, while the oxidation of silicon by silicon oxide is energetically neutral.

Thus, in accordance with the invention, a layer of germanium or germanium silicide is incorporated into a gate conductor material between a gate oxide material and a gate conductor material.

We claim:

1. A semiconductor device comprising:
   a silicon substrate;
   a gate dielectric layer on the silicon substrate; and
   a gate conductor including a relatively thin layer of germanium on the dielectric layer, and a relatively thick layer of gate conductor material on the layer of germanium.

2. The semiconductor device of claim 1 wherein the dielectric layer has a thickness susceptible to substantial degradation of the gate dielectric due to tunneling between the substrate and the gate conductor material in the absence of the layer of germanium.

3. The semiconductor device of claim 1 wherein the dielectric layer has a thickness less than about 60 angstroms.

4. The semiconductor device of claim 1 wherein the germanium layer has a thickness in the range of about 5 angstroms to about 500 angstroms.

5. The semiconductor device of claim 1 wherein the germanium layer has a thickness less than about 50 angstroms.

6. The semiconductor device of claim 1 wherein the dielectric layer comprises a layer of silicon dioxide.

7. The semiconductor device of claim 1 wherein the gate conductor material is selected from a group consisting of aluminum, silicon, tungsten, and tungsten silicide.

8. A field effect transistor comprising:
   a silicon substrate;
   a gate oxide dielectric layer on the silicon substrate; and
   a gate conductor including a relatively thin layer of germanium silicide on the dielectric layer, and a relatively thick layer of gate conductor material on the layer of germanium silicide.

9. The field effect transistor of claim 8 wherein the dielectric layer has a thickness susceptible to substantial tunneling between the substrate and the gate conductor material in absence of the layer of germanium silicide.

10. The field effect transistor of claim 8 wherein the dielectric layer has a thickness less than about 60 angstroms.

11. The field effect transistor of claim 8 wherein the germanium silicide layer has a thickness in the range of about 5 angstroms to about 500 angstroms.

12. The field effect transistor of claim 8 wherein the germanium silicide layer has a thickness less than about 50 angstroms.

13. The field effect transistor of claim 8 wherein the dielectric layer comprises a layer of silicon dioxide.

14. The field effect transistor of claim 8 wherein the gate conductor material is selected from a group consisting of aluminum, silicon, tungsten, and tungsten silicide.

15. The field effect transistor of claim 8 wherein the germanium silicide layer is in the range of about 50% to about 100% germanium.

16. The field effect transistor of claim 8 wherein the germanium silicide layer is in the range of about 90% to about 100% germanium.

* * * * *